United States Patent [19]

Archer et al.

[11] Patent Number: 4,693,957

[45] Date of Patent: Sep. 15, 1987

[54] TRANSITION AND INNER TRANSITION METAL CHELATE POLYMERS FOR HIGH ENERGY RESIST LITHOGRAPHY

[75] Inventors: Ronald D. Archer, Amherst; Christopher J. Hardiman, Belchertown; Ryszard Grybos; James C. W. Chien, both of Amherst, all of Mass.

[73] Assignee: The United States of America as represented by the Secretary of the Navy, Washington, D.C.

[21] Appl. No.: 711,786

[22] Filed: Mar. 14, 1985

[51] Int. Cl.$^4$ .................. G03C 5/00; C08G 79/00
[52] U.S. Cl. ............................... 430/269; 528/9; 528/271; 528/395
[58] Field of Search .................. 528/9, 271, 395; 430/269

[56] References Cited

U.S. PATENT DOCUMENTS

| | | | |
|---|---|---|---|
| 3,242,102 | 3/1966 | Schmeckenbecher | 528/395 |
| 3,384,605 | 5/1968 | Saraceno | 528/395 |
| 3,681,265 | 8/1972 | Krueger | 528/395 |
| 4,284,744 | 8/1981 | Shaffer | 528/9 |

*Primary Examiner*—Wilbert J. Briggs, Sr.
*Attorney, Agent, or Firm*—Prithvi C. Lall; Arthur A. McGill; Michael J. McGowan

[57] ABSTRACT

New transition and inner transition metal chelate polymers and method for synthesizing thereof. Such polymers are used as positive or negative resists of high sensitivity for lithographic purposes in integrated circuit chip fabrication requiring submicron resolution. The polymers when irradiated undergo scission or crosslinking events which affects their solubility in developer solvents. They are synthesized either in nonaqueous solution with subsequent removal of excess solvent or interfacially with almost instantaneous precipitation of the polymer at the interface.

9 Claims, 8 Drawing Figures

TRANSITION AND INNER TRANSITION METAL CHELATE POLYMERS FOR HIGH ENERGY RESIST LITHOGRAPHY

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

(1) Field of the Invention

This invention relates to photoresists for lithographic purposes, and more particularly to transition and inner transition metal chelate polymers for high energy resist lithography.

(2) Statement of Prior Art

Organic polymers have often been used in lithographic procedures, particularly as ultraviolet resists in integrated circuit chip manufacture. These polymers have been used to protect part of the silica ($SiO_2$) on silicon wafers so that minute features can be developed by selective silica removal. However, in the past few years, the capacity of such chips has dramatically increased as minimum feature size has decreased. Furthermore, the use of ultraviolet light for irradiating these polymers increases scattering due to multiple order diffractions. In fact, the mask for ultraviolet radiation are often fabricated by high energy electron beam irradiation which allows smaller features. But the organic polymers are not particularly sensitive to high energy radiation. It is thus desirable to have polymers as resists involving heavier atoms which interact more strongly than in the case of organic polymers.

SUMMARY OF THE INVENTION

The object and advantages of the present invention are accomplished by synthesizing metal chelate polymers consisting of transition metal atoms. The synthesis of these polymers is accomplished either in non-aqueous solution with subsequent removal of excess solvent or interfacially with almost instantaneous precipitation of the polymer at the interface.

The transition metal chelate polymers possess backbones (i.e., the atoms situated along the length of the chain) of alternating metal ions and bridging ligands selected for chelation and radiation-sensitivity. Pendent ligands on the metal ions help provide solubility and prevent excessive cross-linking (which produces the effect opposite to the scission process of the polymers). The chelate polymers have sufficient chainlength and solubility to form good films. Furthermore, the films adhere well to silica and can provide oxide coatings for dry edge protection. Furthermore, by modifying the bridging ligands, the radiation sensitivity of the chelate polymers can also be changed.

An object of subject invention is to have new positive and negative resists for lithographic purposes which possess scission characteristics superior to those of the organic polymer resists which are essential for integrated circuit chip fabrication.

Another object of subject invention is to have resists which have high sensitivity to high energy radiation including electron beam, X-ray, gamma ray and ion beam.

Still another object of subject invention is to have resists which have sufficient chainlength and solubility to form good films.

Still another object of subject invention is to have transition or inner transition metal polymer resists which are tractable (i.e., dissolvable in a solvent) after irradiation thereof.

Another object of subject invention is to have transition or inner transition metal polymer resists which provide sufficient sensitivity to the high radiation which can provide the necessary resolution required for submicron features resolution for integrated circuit fabrication.

Other objects, advantages and novel features of subject invention are accomplished by illustrating the following examples of the best mode of carrying out the invention. However, it should be clearly understood that these examples should not be construed as being limited in the scope or spirit of the invention. It should further be noted that according to the teachings of subject invention, the novel features of the invention include: synthesizing new transition or inner transition metal chelate polymers as resists for lithographic purposes with different bridging ligands to different transition and inner transition metal elements and different pendant ligands in order to vary the various characteristics of the resists which are desirable for lithographic purposes. It should further be understood that the examples described below detail the preparation of such new transition and inner transition metal chelate polymers when considered in conjunction with the accompanying drawing wherein:

DESCRIPTION OF PREFERRED EMBODIMENT

Figure 1:
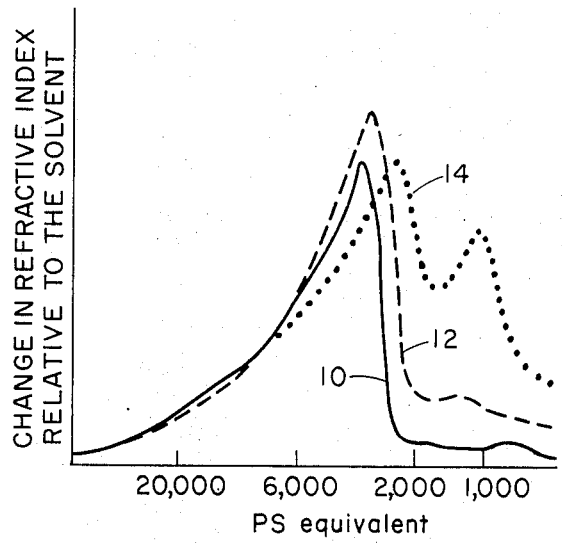
FIGS. 1, 2 and 8 represent graphically the presence of various polymers during GPC (Gel Permeation Chromatography) or SEC (Size Exlusion Chromatography) tests.

The teachings of subject invention are illustrated by the synthesis of various transition or inner transition metal chelate polymers which were prepared in the following conventional manner:

The synthesis of the new transition or inner transition metal chelate polymers was accomplished either in a nonaqueous solution with subsequent removal of excess solvent or interfacially with almost instantaneous precipitation of the polymer at the interface.

As an example of the first method, 1.000 grams of thiodiglycolic acid; recrystallized from benzene/ethanol (20:1 volume/volume), dried in vacuo at 56° C., and stored at 0° C.--all protected from light; and 2.8251 grams of uranyl acetate dihydrate (to provide an equimolar quantity) were added to 100 milliliter (mL) of dimethyl sulfoxide. The mixture was stirred until both reagents were completely dissolved. The solution was then heated in an oil bath at 45° C. Dimethyl sulfoxide and acetic acid were distilled under reduced pressure for approximately six hours, by which time a clear pale yellow glass-like film was deposited on the walls of the reaction flask. Mechanical abrasion of the product caused the film to crumble to a yellow powder. The powder was then dried in vacuo at 100° C. for 15 hours. Elemental analysis and proton NMR confirmed two moles of dimethyl sulfoxide per mole of uranyl and per mole of thiodiglycolate.

The other uranyl species were synthesized in an analogous manner. The vanadyl species synthesis was similar except that vanadyl acetylacetonate was used as the vanadium source and dimethyl sulfoxide and acetylacetone were distilled from the reaction solution under reduced pressure.

Critical elements in the syntheses include pure reactants, exact 1:1 mole ratios of the metal salt and the bridging ligand and a solvent such a dimethyl solfoxide (or pyridine or N-methyl pyrrolidone, also known as N-methyl-2-pyrrolidinone, or water) which acts as a ligand to uranyl or vanadyl to prevent crosslinking by a third bridging ligand donor as crosslinking inhibits solubility.

The interfacial syntheses were performed by mixing diethyl ether solution or uranyl nitrate with sodium salts of bridging ligands in water in a high speed blender behind an explosion shield. Reaction times were typically thirty seconds. The precipitates were dried in vacuo and protected from the light. Diethyl ether solutions of uranyl nitrate are said to be shock sensitive. After finding no particular advantage to this method other than time of reaction, the nonaqueous solution method was used almost exclusively.

It should be noted that film-forming metal chelate polymers are difficult to synthesize and intractability has normally been the norm for such species. However, oxo-metal ions in bulky coordinating solvents solve the intractability problem, when coupled with bridging ligands which can displace any anions associated with oxo-metal ions.

It should be noted that most of the transition metal chelate polymers are soluble in polar organic solvents such as dimethyl sulfoxide and N-methyl-2-pyrrolidinone. Most of the species form films from solution and the films appear to adhere well to silica.

The radiation sensitivity properties of the metal chelate polymers are quite variable. In fact, both very sensitive positive and negative resist polymers appear possible from these materials. A positive resist depends on the chain scission characteristics of the polymer under irradiation conditions. Whereas the industry standard, poly(methylmethacrylate) or PMMA, has a $G_s$ value of 1.3, where $G_s$ signifies the number of chemical scission events per 100 eV (electron volts) of energy absorbed, some of the metal chelate polymers exceed 100. Crosslinking predominates in negative resists. A value of 86 was obtained for $G_x$ which signifies the number of chemical crosslinking events per 100 eV of energy absorbed in one example of a negative resist. Organic polymers with $G_s$ and $G_x$ values of around 10 are known and are being developed by other people in this field.

Figure 2:
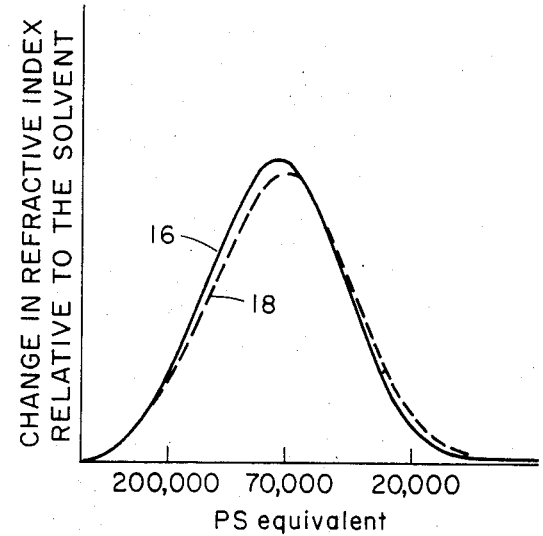

The improved sensitivity of these species to irradiation has been found with 0.67 MeV cesium-137 radiation and thus these species should require appreciably less exposure time than current organic polymers. Given the photoelectric effect energy profiles, these could be even better at the more modest energies of the soft X-rays or electron beams. The synthesis of a number of uranyl polymers with dicarboxylate bridging ligands has shown the possibilities available through the use of oxo-ions to avoid intractability. Most of the species are listed in Table 1. They form films from solutions and appear to adhere well to silica, and have variable resist properties. A GPC (Gel Permeation Chromatography) comparison of uranyl thiodiglycolate with poly(methylmethacrylate), hereinafter abbreviated as PMMA is shown in FIG. 1 wherein curves 10, 12 and 14 indicate the appearance of the chelate polymer when polymer is unirradiated, dose of 0.5 megarad (hereinafter abbreviated as Mrad) and dose of 1.5 Mrad of $Cs^{137}$ irradiation. FIG. 2 shows the GPC of PMMA with curves 16 and 18 for unirradiated and 1.68 Mrad $C^{137}$ irradiation of PMMA respectively. The plots of FIGS. 1 and 2 indicate changes in refractive index (y-axis) vs. molecular weight relative to polystyrene. It should be noted that the values of $M_n$ given in Table 1 below are the values based on GPC or SEC and viscosity in NMP relative to polystyrene. Furthermore, the uranyl polymers of dimethylsuccinate and tetramethylpimelate were also synthesized in pyridine and interfacially producing pyridine and diaqua-adducts. As mentioned earlier, $G_s$ and $G_x$ represent the number of scission events per 100 eV (electron volt) and crosslinking events per 100 eV of energy respectively. The values in Table 1 are based on radiation from a cesium-137 ($Cs^{137}$) source with intensities of 0.02 to 0.07 Mrad/hour.

TABLE 1

| Ligand | $\overline{M}_n$ | Empirical Formula | $(G_s-G_x)$ |
|---|---|---|---|
| Thiodiglycolate | 5,000 | $UO_2(O_2CCH_2SCH_2CO_2)(C_2H_6SO)_2$ | 105 |
| Fumarate | 10,000 | $UO_2(trans-O_2CCH=CHCO_2)(C_2H_6SO)_2$ | 65 |
| Maleate | 8,000 | $UO_2(cis-O_2CCH=CHCO_2)(C_2H_6SO)_{1.75}$ | −4 |
| Phthalate | 10,000 | $UO_2(o-O_2CC_6H_4CO_2)(C_2H_6SO)_2$ | −9 |
| 3,3-Dimethylglutarate | 10,000 | $UO_2[O_2CCH_2C(CH_3)_2CH_2CO_2](C_2H_6SO)$ | −11 |
| 2,2-Dimethylsuccinate | 7,000 | $UO_2[O_2CC(CH_3)_2CH_2CO_2](C_2H_6SO)$ | −20 |
| 2,2-Dimethylglutarate | 30,000 | $UO_2[O_2CC(CH_3)_2CH_2CH_2CO_2](C_2H_6SO)$ | −23 |
| 2,2,6,6-Tetramethylpimelate | 6,000 | $UO_2[O_2C(CH_3)_2(CH_2)_3C(CH_3)_2CO_2](C_2H_6SO)$ | −86 |
| Thiobis(acetylacetonate) | 5,000 | $UO_2[C_{10}H_{12}O_4S](C_2H_6SO)$ | >100 |
| Thiobis(acetylacetonate) | 10,000 | $VO_2[C_{10}H_{12}O_4S](C_2H_6SO)$ | 120 |

Figure 3:
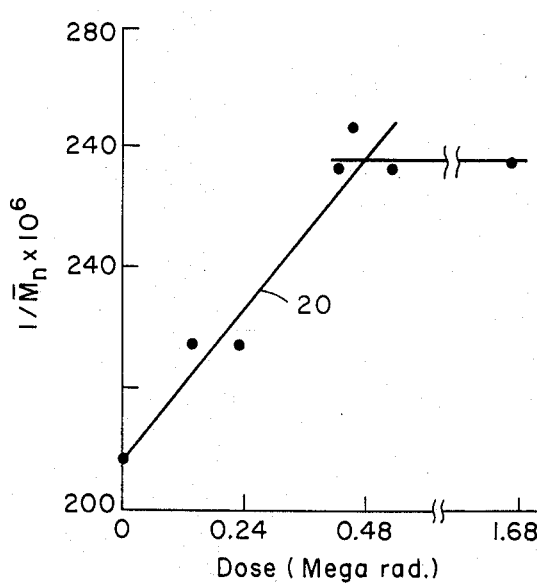
FIG. 3–7 are graphical plots of $1/\overline{M}_n$ versus dose rate of the radiation for various new transition metal chelate polymers as described in subject patent application.

It should be pointed out that the chemical structure of the chelate polymers was studied using the standard techniques such as infrared spectroscopy, NMR (Nuclear Magnetic Resonance) spectroscopy thermal analysis besides drawing analogy with other materials of known chemical structure FIG. 3 represents a plot of $1/\overline{M}_n \times 10^6$ vs. dose in Mrad where the best fit is straight line 20 which is used to find the value of $G_s-G_x$ for poly(uranylthiodiglycolate). The value of $G_s-G_x$ is given by the formula:

$$1/\overline{M}_n = 1/\overline{M}_{no} + (G_s-G_x) \times 1.04 \times 10^{-6} R$$

where $\overline{M}_n$ is the molecular weight relative to polystyrene at a particular dose and $M_{no}$ is the molecular weight of the unirradiated sample and R is the dose in Mrad. Alternative formula is:

$$1/\overline{M}_n = 1/\overline{M}_{no} + (G_s-G_x) R/100N$$

where R is dose in eV and N is the Avogadro number.

Figure 4:
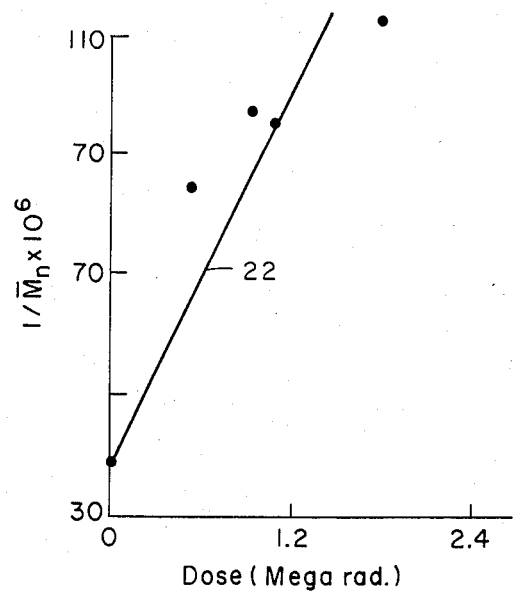
Figure 5:
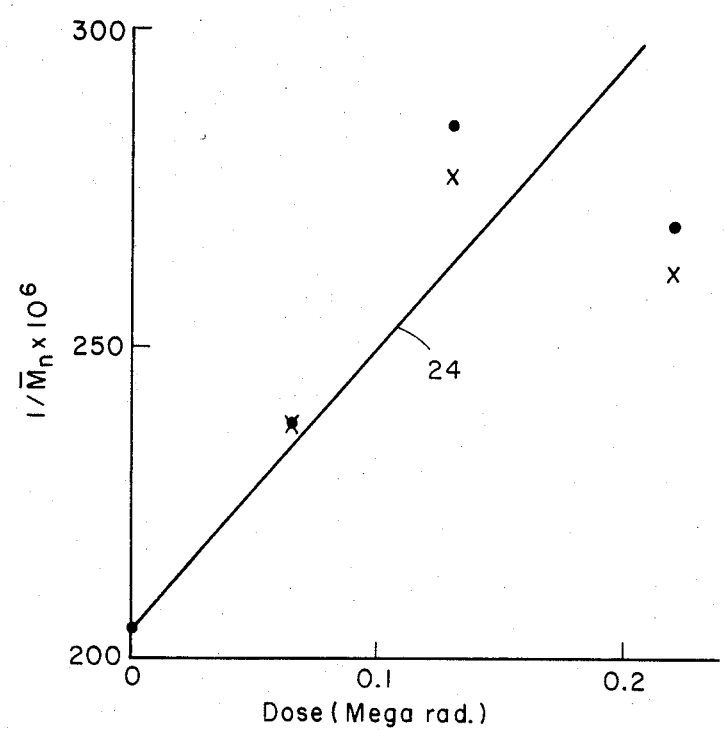
Figure 6:
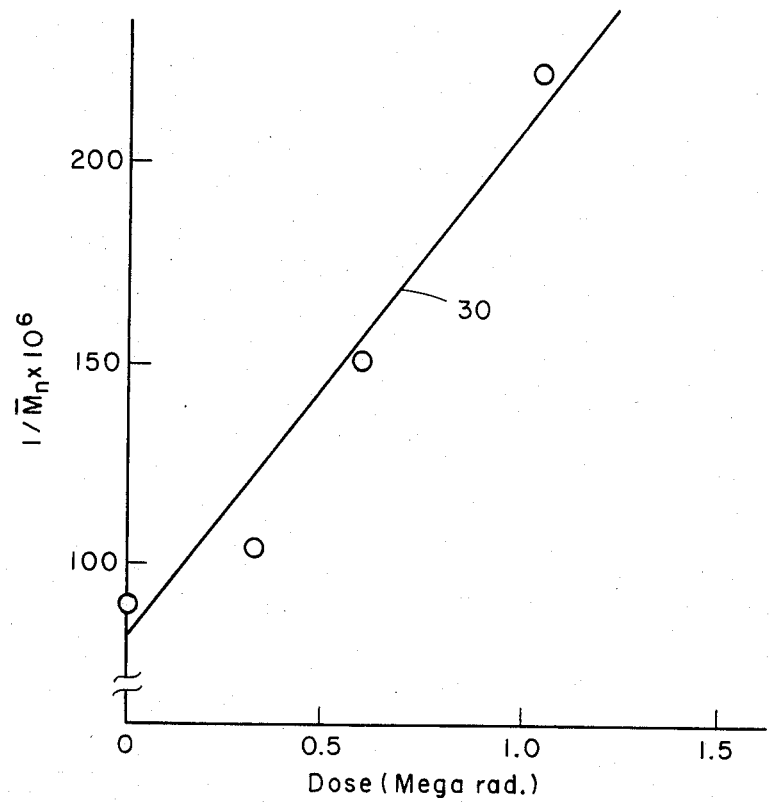
Figure 7:
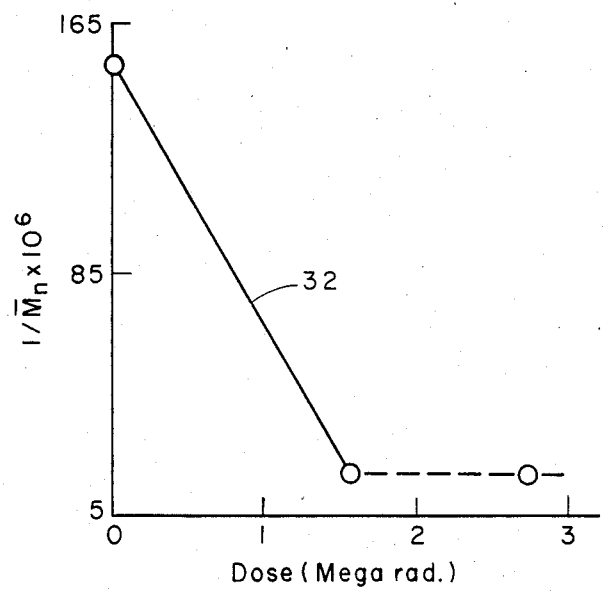
Figure 8:
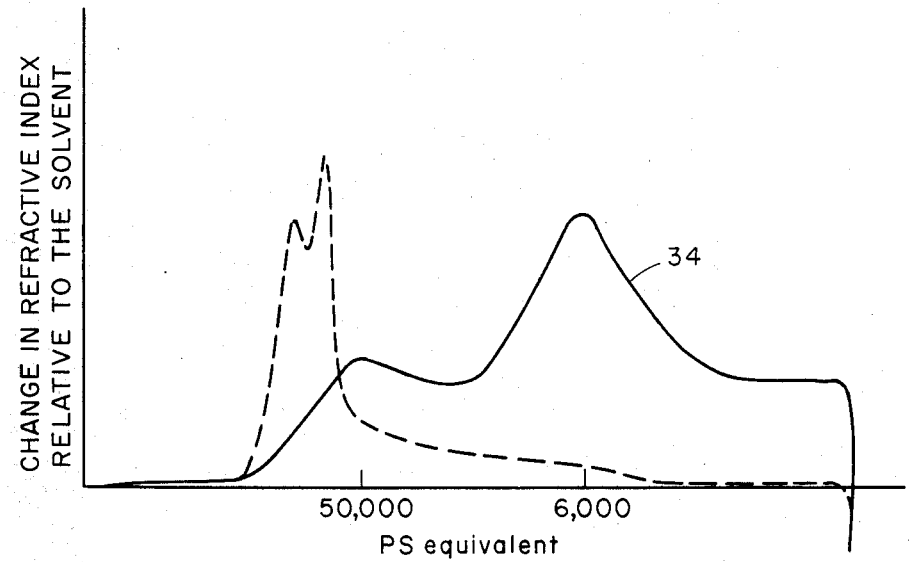

FIGS. 1 and 3 are correlated as they represent measurements for poly (uranyl thiodiglycolate). FIGS. 4 and 5 are similar to FIG. 3 for poly(uranylfumarate) and poly(uranyl[acacSacac] or poly(uranyl-thiobis-[acetylacetonate]) wherein the straight lines 22 and 24 respectively give the best fit to the data. FIG. 6 is a plot for [VO(acacSacac)] or [vanadyl thiobis(acetylacetonate] where the best fit is straight line 30 which gives a value of 120 for $(G_s - G_x)$. FIG. 7 is analogous to FIGS. 3–6 wherein best fit 32 is for a negative resist $UO_2$ (2,2,6,6=tetramethylpimelate) vs. dose ($Cs^{137}$) and gives a value of $-86$ based upon 0 to 1.6 Mrad dose rate points. FIG. 8 is a curve similar to that of FIG. 1 indicating straight line 34 as the best fit for this metal chelate polymer using the polystyrene standard calibration.

It should be noted that the structural formulas for uranyl polymers to represent the various new transition or inner transition metal chelate polymers synthesized according to the teachings of subject invention are given below:

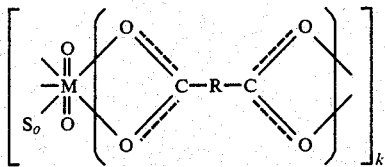

where k is a positive integer. M is the transition or inner transition metal ion, $S_o$ represents one or two molecules of a polar coordinating solvent, R being any of the organic groups, e.g., alkyl, branched alkyl, thiodialkyl; alkene, thio or other sulfur derivatives which are functionalized to provide scission or crosslinking upon irradiation of the polymer. Other general structural formulas which include:

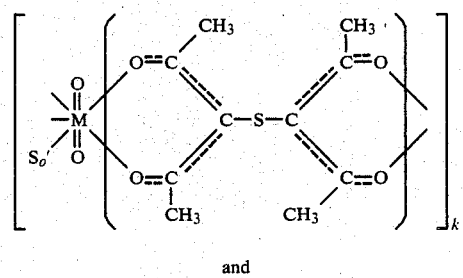

and

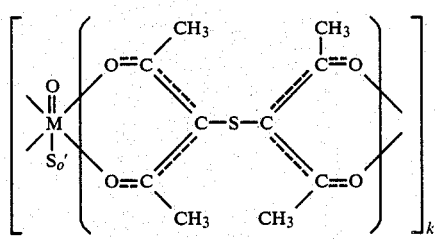

where k is a positive integer, $S_0'$ represents one molecule of a polar coordinating solvent and S is a sulphur ion.

Briefly stated, new transition or inner transition metal chelate polymers are synthesized according to the teachings of subject invention either in non-aqueous solution with subsequent removal of excess solvent or interfacially with almost instantaneous precipitation of the polymer at the interface.

Obviously, many modifications and variations of the present invention are possible in the light of the above teachings. For example, the ligands used and the transition metals used can vary without deviating from the teachings of subject invention. The mode of synthesis may also be varied. It is therefore understood that within the scope of the appended claims the invention may be practiced otherwise than as specifically described.

We claim:

1. Transition and inner transition chelate polymer resists for lithographic procedures having the formula:

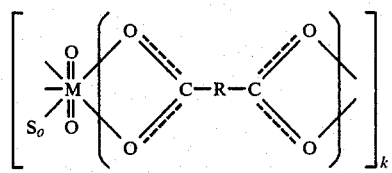

where k is a positive integer so as to have the number average molecular weight of said chelate polymer to be at least 5,000, M is the transition or inner transition metal ion, $S_o$ represents one molecule of a polar coordinating solvent, R is a member of a functionalized organic group to provide scission or cross linking upon irradiation of said chelate polymer, and each dashed line represents half a bond.

2. The polymer of claim 1 wherein $S_o$ represents two molecules of the polar coordinating solvent.

3. The polymer of claim 2 wherein said functionalized group is selected from alkyl, alkene, thiodialkyl, and other sulfur derivatives.

4. Transition and inner transition metal chelate polymer resists for lithographic procedures having the formula:

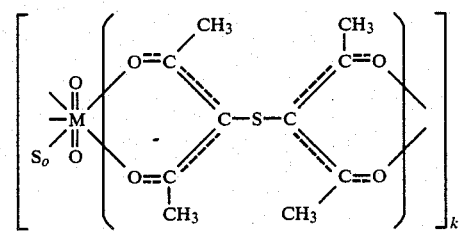

where k is a positive integer so as to have the number average molecular weight of said chelate polymer to be at least 5,000, M is a transition or inner transition metal ion, S is a sulfur ion, $S_o$ represents one molecule of a polar coordinating solvent and each dashed line represents half a bond.

5. The polymer of claim 4 wherein $S_o'$ represent two molecules of the polar coordinating solvent.

6. A method for synthesizing a transition or inner transition metal chelate polymer of claim 1 using thiodiglycolic acid, uranyl acetate dihydrate and dimethyl sulfoxide wherein said method includes the steps of:

mixing 1.000 gram of thioglycolic acid; recrystallized from benzene/ethanol (20:1 v/v) dried in vacuo at 56° C. and stored at 0° C. in light free atmosphere; with 2.8251 grams of uranyl acetate dihydrate in 100 mL of dimethyl sulfoxide;

stirring the mixture thereof;

heating the mixture in an oil bath at 45° C.;

distilling dimethyl sulfoxide and acetic acid under reduced pressure; and obtaining a film of the polymer.

7. A method for synthesizing a vanadyl chelate polymer using thiobis (acetylacetone), vanadyl acetylacetonate, and dimethyl sulfoxide as the reagents wherein said method includes the steps of:

mixing 1 mole of thiobis (acetylacetone) with 1 mole of vanadyl acetylacetonate in 150 mL of dimethyl sulfoxide at 45° C.;

stirring the mixture thereof;

heating the mixture in an oil bath at 45° C.;

distilling dimethyl sulfoxide and acetyl acetone under reduced pressure; and obtaining a film of the vanadyl polymer.

8. The polymer of claim 1 wherein said functionalized organic group is selected from alkyls, alkenes, thioalkyls, and other sulfur derivatives for providing scission or cross linking upon irradiation of said chelate polymer.

9. Transition and inner transition metal chelate polymer resists for lithographic purposes having the formula:

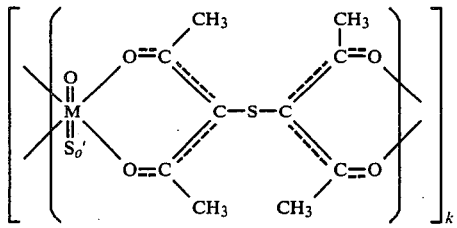

where k is a positive integer so as to make the number average molecular weight of said polymer to be at least 5000, M is a transition or inner transition metal ion, $S_o$ represents one molecule of a polar coordinating solvent, S is a sulfur ion and each dashed line represents half a bond.

* * * * *